United States Patent [19]
Dunn et al.

[11] Patent Number: 5,502,410
[45] Date of Patent: Mar. 26, 1996

[54] CIRCUIT FOR PROVIDING A VOLTAGE RAMP SIGNAL

[75] Inventors: Pak-Kong Dunn, Kwun Tong; Kwok-Ban Nip, KLN; Chi-Man Lin, Kowloon, all of Hong Kong

[73] Assignee: Motorola, Inc., Schaumburg, Ill.

[21] Appl. No.: 212,750

[22] Filed: Mar. 14, 1994

[51] Int. Cl.⁶ ............................................ H03K 4/06
[52] U.S. Cl. ................... 327/140; 327/131; 327/94; 327/103
[58] Field of Search ....................... 327/89, 91, 92, 327/93, 94, 73, 130, 131, 58, 142, 137, 103, 134, 136, 140

[56] References Cited

U.S. PATENT DOCUMENTS

| | | | |
|---|---|---|---|
| 4,284,906 | 8/1981 | Manfredi | 307/228 |
| 4,945,292 | 7/1990 | Ackerson et al. | 315/387 |
| 5,196,741 | 3/1993 | Rustici | 307/353 |
| 5,394,020 | 2/1995 | Nienaber | 322/140 |

*Primary Examiner*—John S. Heyman
*Assistant Examiner*—Dinh T. Le
*Attorney, Agent, or Firm*—Rennie William Dover

[57] ABSTRACT

A circuit (10) for generating a voltage ramp signal ($V_{RAMP}$) having minimum amplitude variation over a large frequency range has been provided. The circuit includes a comparator (40) for comparing a voltage across a ramp capacitor (32) with a reference voltage. From the result of this comparison, a sampling capacitor (16) is discharged during the time that the voltage ramp signal is less than the reference voltage and charged during the time that the voltage ramp signal is greater than the reference voltage. The resulting voltage across the sampling capacitor is held and fed back to a transconductance amplifier (20) which adjusts the current that charges the ramp capacitor thereby adjusting the peak amplitude of the voltage ramp signal.

8 Claims, 3 Drawing Sheets

CIRCUIT FOR PROVIDING A VOLTAGE RAMP SIGNAL

FIELD OF THE INVENTION

This invention relates to ramp signals and, in particular, to a circuit for providing a constant vertical ramp signal over a large operating frequency range.

BACKGROUND OF THE INVENTION

There exists a need for generating vertical ramp signals in many applications such as in a time base processor for a multi-sync monitor. However, the amplitude variation of vertical ramp signals can vary significantly over a large operating frequency range. For example, part number TDA4851 manufactured by Philips provides a 2.4 voltage ramp signal with an amplitude variation of 3 percent over an operating frequency of 40 Hertz to 125 Hertz. This amplitude variation can be unacceptable in many applications.

Hence, there exists a need to generate a vertical ramp signal having minimum amplitude variation over a large operating frequency range.

DETAILED DESCRIPTION OF THE DRAWINGS

Figure 1:
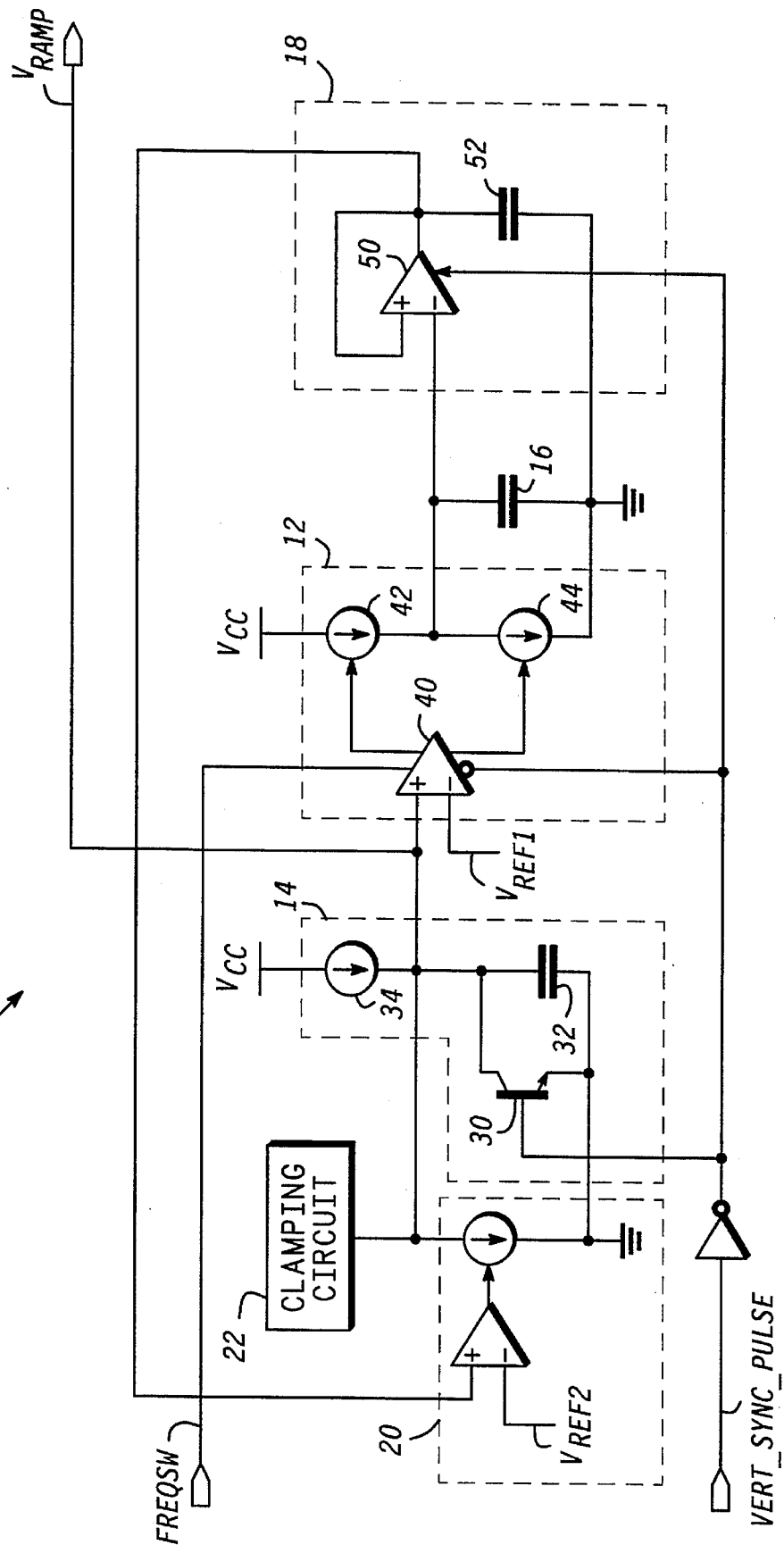
FIG. 1 is a detailed schematic/block diagram illustrating a circuit for providing a voltage ramp signal in accordance with the present invention.

Referring to FIG. 1 there is illustrated a detailed schematic/block diagram of circuit 10 for providing a voltage ramp signal ($V_{RAMP}$). Circuit 10 includes comparator circuit 12 which has a first input coupled to an output of ramp generator 14 and second input coupled to receive a first reference voltage $V_{REF1}$. The output of comparator circuit 12 is coupled to a first terminal of sampling capacitor 16 and to a first input of sample and hold circuit 18. A second terminal of capacitor 16 is returned to ground.

An output of sample and hold circuit 18 is coupled to a first input of transconductance amplifier 20. The second input of transconductance amplifier 20 is coupled to receive a second reference voltage $V_{REF2}$. The output of transconductance amplifier 20 is coupled to clamping circuit 22 and to the output of ramp generator 14. Ramp generator 14, comparator circuit 12, and sample and hold circuit 18 all have respective inputs coupled to receive a vertical sync pulse signal, VERT_SYNC_PULSE.

In particular, ramp generator 14 includes transistor 30 having a base coupled to receive the vertical sync pulse signal and an emitter returned to ground. The collector of transistor 30 is coupled through ramp capacitor 32 and return to ground. Additionally, the collector of transistor 30 is coupled through current source 34 to a first supply voltage terminal at which the operating potential $V_{CC}$ is applied. Also, the collector of transistor 30 is coupled to the output of ramp generator 14 which provides voltage ramp signal $V_{RAMP}$.

Comparator circuit 12 includes comparator 40 having a first input coupled to the output of ramp generator 14 and a second input coupled to receive voltage $V_{REF1}$. Comparator 40 is enabled via the vertical sync pulse signal and is coupled to receive frequency switching signal FREQSW. A first output of comparator 40 is coupled to switchable current 42 while a second output of comparator 40 is coupled to switchable current source 44. Switchable current source 42 is coupled between the first supply voltage terminal and the output of comparator circuit 12 while switchable current source 44 is coupled between the output of comparator circuit 12 and ground reference.

Sample and hold circuit 18 includes buffer 50 having a first input coupled to the output of comparator circuit 12 and to the first terminal of sampling capacitor 16. The second input of buffer 50 is coupled to the output of buffer 50 and to the output of sample and hold circuit 18. The output of buffer circuit 50 is coupled through hold capacitor 52 and returned to ground.

In operation, when a vertical sync pulse signal is applied to circuit 10, transistor 30 rendered operative and begins to discharge ramp capacitor 32. However, due to clamping circuit 22, the voltage appearing at the collector of transistor 30, which is the voltage ramp signal ($V_{RAMP}$), will not fall below a predetermined voltage, for example, 1.5 volts. Thus, the voltage across ramp capacitor 32 will be kept at a 1.5 volt minimum during the vertical sync period and this is the start up voltage for signal $V_{RAMP}$.

Also during the vertical sync pulse period, comparator 40 is disabled while sample and hold circuit 18 is enabled. As a result, the voltage appearing across sampling capacitor 16 remains constant and is coupled through buffer circuit 50 and transferred across holding capacitor 52. Hold capacitor 52 applies a voltage at the first input of transconductance amplifier 20 which has the effect of adjusting the current at the output of transconductance amplifier 20 thereby adjusting the charging current for ramp capacitor 32. In this manner, the voltage appearing across hold capacitor 52 controls and adjusts the amplitude of the voltage ramp signal $V_{RAMP}$ as will be explained in detail hereinafter.

After the vertical sync pulse period, that is, when the vertical sync pulse signal transitions from a logic low to a logic high, transistor 30 is rendered non-operative and the ramp capacitor 32 will be charged up by a DC current via the current supplied from current source 34 less the current sunk by the output of transconductance amplifier 20. As a result, a voltage ramp signal across capacitor 32 is developed. This voltage ramp signal will start only at the end of the vertical sync period thereby eliminating vertical jittering.

During this pulse period, comparator 40 is enabled and the voltage ramp signal $V_{RAMP}$ is compared with a reference voltage $V_{REF1}$ to control the charging and the discharging of sampling capacitor 16. If the center (mid-point) voltage of ramp signal $V_{RAMP}$ is the same as reference voltage $V_{REF1}$, then current source 42 is enabled for the same amount of time that current source 44 is enabled and the charging and discharging time for sampling capacitor 16 is the same. As a result, the voltage across capacitor 16 will remain unchanged from the previous pulse period. However, if the center voltage of ramp signal $V_{RAMP}$ is NOT the same as reference voltage $V_{REF1}$, then the resulting voltage across sampling capacitor 16 will decrease if the amplitude of ramp signal $V_{RAMP}$ is too small or will increase if the amplitude of voltage ramp signal $V_{RAMP}$ is too large. In this manner, the voltage across sampling capacitor 16 is a voltage indicative of the amplitude of voltage ramp signal $V_{RAMP}$.

Figure 2:
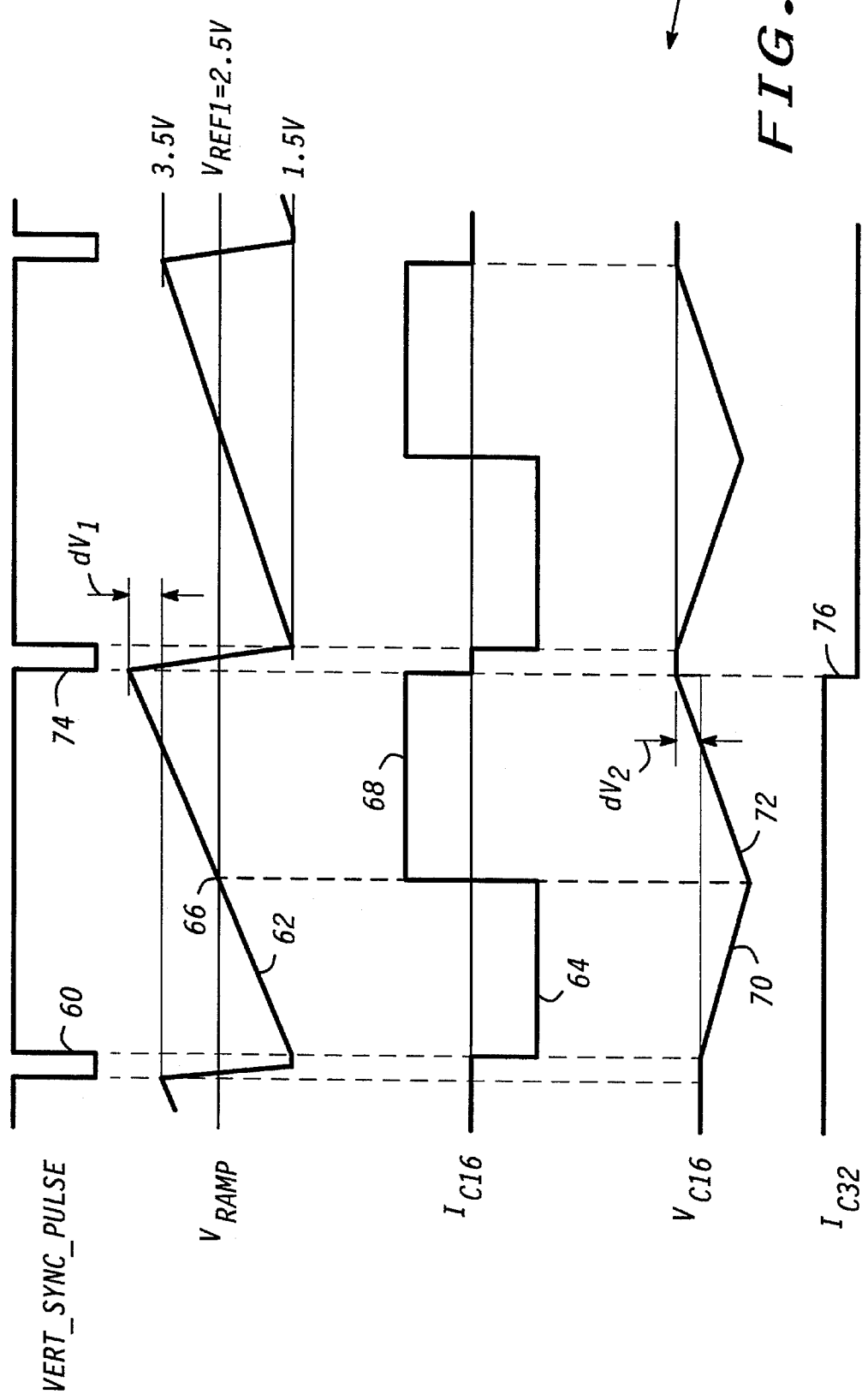
FIG. 2 is a graphical diagram illustrating typical wave forms of various signals associated with the circuit of FIG. 1.

Referring to FIG. 2, a graphical diagram illustrating typical wave forms of various signals associated with the circuit of FIG. 1 is shown. During the first vertical sync pulse period as represented by pulse 60 of signal VERT_ SYNC_PULSE, transistor 30 is rendered operative and signal $V_{RAMP}$ is discharged to a predetermined minimum voltage as set by clamping circuit 22, for example, 1.5 volts. The current through capacitor 16 as represented by wave form $I_{C16}$, is substantially equal to zero since comparator 40 is rendered non-operative. Also, the voltage across capacitor 16, as represented by wave form $V_{C16}$, is substantially constant. Moreover, it is this voltage across capacitor 16 that is held via sample and hold circuit 18 and fed back to the first input of transconductance amplifier 20.

Once pulse 60 disappears, transistor 30 is rendered non-operative and the voltage across capacitor 32 begins to increase as represented by line segment 62. For the portion that line segment 62 is below reference voltage $V_{REF1}$, current source 44 discharges capacitor 16 wherein the current through capacitor 16 ($I_{C16}$) is represented as a negative value as shown by line segment 64 and the voltage across capacitor 16 ($V_{C16}$) is decreasing as represented by line segment 70.

However, once line segment 62 exceeds reference voltage $V_{REF1}$, then current source 42 begins to charge capacitor 16 wherein the current through capacitor 16 has a positive value as represented by line segment 68 and the voltage across capacitor 16 ($V_{C16}$) is increasing as represented by line segment 72.

In this example, it is important to note that since voltage $V_{RAMP}$ has increased its peak amplitude value from its previous peak amplitude value by a voltage as represented by $dV_1$. As a result, the time spent charging capacitor 16 as represented by the length of line segment 68 is longer than the time spent discharging capacitor 16 as represented by the length of line segment 64. The voltage across capacitor 16 will therefore increase from its previous value (before pulse 60) as represented by voltage $dV_2$.

During the second vertical sync pulse period as represented by pulse 74, this new voltage appearing across capacitor 16 is held via sample and hold circuit 18 and is applied to the first input of transconductance amplifier 20. Since this voltage represents an increased voltage from the previous pulse period, transconductance amplifier 20 functions to sink an increased current at its output thereby reducing the available current ($I_{C32}$) for charging capacitor 32 as represented by transition 76. In other words, since the amplitude of signal $V_{RAMP}$ has increased, the voltage across capacitor 16 has also increased as well as the current sunk by transconductance amplifier 20. Thus, the increased current sunk by transconductance amplifier 20 decreases the available current to charge capacitor 32 and thereby adjusts (in this case reduces) the peak voltage of signal $V_{RAMP}$.

It should be understood that in a similar manner, an adjustment to the current through capacitor 32 is made if the voltage across capacitor 16 is less than its previous value wherein the current sunk by transconductance amplifier 20 is decreased to allow more current to charge capacitor 32.

Figure 3:
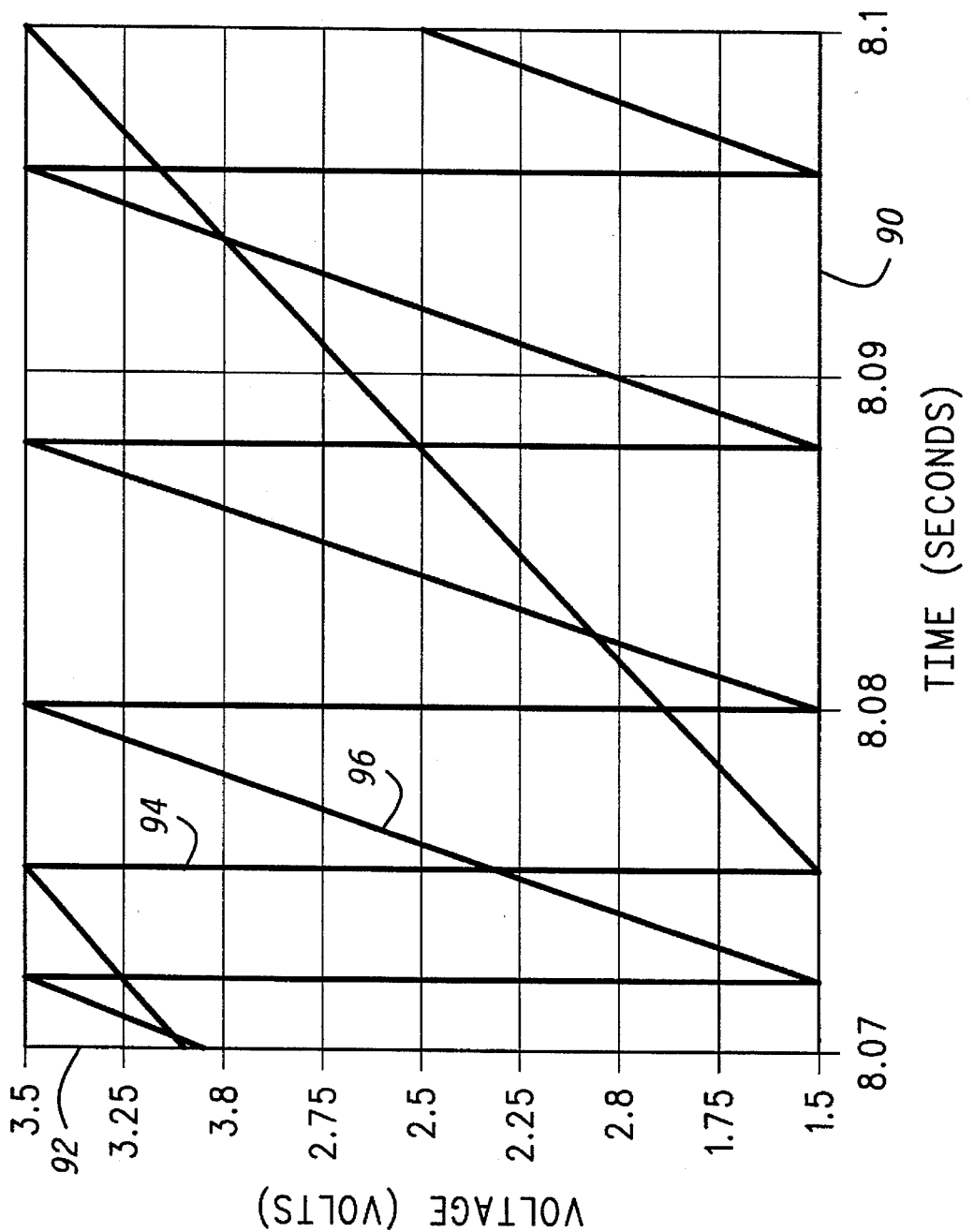
FIG. 3 is a graphical diagram illustrating simulation results of the voltage ramp signal generated by the circuit of FIG. 1 while operating at frequencies of 40 Hertz and 125 Hertz.

Referring to FIG. 3, a graphical diagram illustrating simulation results of voltage ramp signal $V_{RAMP}$ as generated by the circuit of FIG. 1 while operating at frequencies of 40 Hertz and 125 Hertz is shown. Horizontal axis 90 represents time (in seconds) while vertical axis 92 represents voltage (in volts). Moreover, wave form 94 represents signal $V_{RAMP}$ for circuit 10 of FIG. 1 operating at a frequency substantially equal to 40 Hertz. Additionally, wave form 96 represents signal $V_{RAMP}$ of circuit 10 of FIG. 1 operating at a frequency substantially equal to 125 Hertz. From FIG. 3, one can clearly see that the amplitude variation between wave forms 94 and 96 are minimal. In particular, the amplitude variation is less than 0.5% over the operating frequency of 40 Hertz and 125 Hertz. In addition, it has also been simulated that the amplitude variation of signal $V_{RAMP}$ varies less than 1% over a temperature range of 25° C. to 125° C. Thus, the present invention provides a circuit for generating a voltage ramp signal having minimal amplitude variation when operating over a large frequency range. Moreover, the voltage ramp signal has minimal amplitude variation while operating over a large temperature range.

Circuit 10 also includes an additional feature. When the incoming vertical pulse signal is greater than a predetermined frequency, for example 85 Hertz, signal FREQSW is active and doubles the current output of comparator 40 thereby increasing the ac loop gain. This allows circuit 10 to operate at even higher frequencies while still maintaining minimum amplitude variation with fast pull in time.

By now it should be apparent from the forgoing disclosure that a novel circuit for generating a voltage ramp signal having minimum amplitude variation over a large frequency range has been provided. The circuit includes a comparator for comparing a voltage across a ramp capacitor with a reference voltage. From the result of this comparison, a sampling capacitor is discharged during the time that the voltage ramp signal is less than the reference voltage and charged during the time that the voltage ramp signal is greater than the reference voltage. The resulting voltage across the sampling capacitor is held and fed back to a transconductance amplifier which adjusts the current that charges the ramp capacitor thereby adjusting the peak amplitude of the voltage ramp signal.

While the invention has been described in specific embodiments thereof, it is evident that many alteration, modifications and variations will be apparent to those skilled in the art. Further, it is intended to embrace all such alterations, modifications and variations in the appended claims.

We claim:

1. A circuit for providing a voltage ramp signal, comprising:

a ramp generator having an input and an output, said input of said ramp generator being coupled to receive a pulse signal, said output of said ramp generator coupled for providing the voltage ramp signal;

a comparator circuit responsive to said pulse signal and having an input and an output, said input of said comparator circuit coupled to said output of said ramp generator;

a first capacitor having first and second terminals, said first terminal of said first capacitor coupled to said output of said comparator circuit, said second terminal of said first capacitor coupled to a first supply voltage terminal;

a sample and hold circuit responsive to said pulse signal and having an input and an output, said input of said sample and hold circuit coupled to said first terminal of said first capacitor; and a transconductance amplifier having an input and an output, said input of said transconductance amplifier coupled to said output of said sample and hold circuit, said output of said transconductance amplifier coupled to said output of said ramp generator.

2. The circuit according to claim 1 further including a clamping circuit coupled to said output of said ramp generator for clamping the voltage ramp signal to a minimum voltage.

3. The circuit according to claim 1 wherein said ramp generator includes:

a transistor having a collector, a base and an emitter, said collector of said transistor coupled to said output of said ramp generator, said base of said transistor coupled to receive said pulse signal, said emitter of said transistor coupled to said first supply voltage terminal;

a second capacitor having first and second terminals, said first terminal of said second capacitor coupled to said output of said ramp generator, said second terminal of said second capacitor coupled to said first supply voltage terminal; and a current source coupled between a second supply voltage terminal and said output of said ramp generator.

4. The circuit according to claim 1 wherein said comparator circuit includes:

a comparator having first and second inputs and first and second outputs and an enable input, said enable input of said comparator coupled to receive said pulse signal, said first input of said comparator coupled to said output of said ramp generator and serving as said input of said comparator circuit, said second input of said comparator coupled to receive a first reference voltage;

a first switchable current source having first and second terminals and a control terminal, said first terminal of said first switchable current source coupled to said output of said comparator circuit, said second terminal of said first switchable current source coupled to said first supply voltage terminal, said control terminal of said first switchable current source coupled to said second output of said comparator; and a second switchable current source having first and second terminals and a control terminal, said first terminal of said second switchable current source coupled to a second supply voltage terminal, said second terminal of said second switchable current source coupled to said output of said comparator circuit, said control terminal of said second switchable current source coupled to raid first output of said comparator.

5. The circuit according to claim 1 wherein said sample and hold circuit includes:

a buffer circuit having first and second inputs and an output, said first input of said buffer circuit coupled to said output of said comparator circuit, said second input of said buffer circuit coupled to said output of said buffer circuit, said output of said buffer circuit coupled to said input of said transconductance amplifier; and a second capacitor having first and second terminals, said first terminal of said second capacitor coupled to said output of said buffer circuit, said second terminal of said second capacitor coupled to said first supply voltage terminal.

6. A method for providing a voltage ramp signal, the method comprising the steps of:

in response to a pulse signal provided at an input terminal being in a first logic state, discharging a first capacitor in a ramp circuit;

in response to said pulse signal being in a second logic state, charging said first capacitor with a first current for providing said voltage ramp signal at an output terminal;

discharging a second capacitor coupled to said output terminal when said voltage appearing across said first capacitor is less than a reference voltage (VREF1);

charging said second capacitor when said voltage appearing across said first capacitor is greater than said reference voltage;

holding a voltage appearing across said second capacitor wherein said voltage appearing across said second capacitor is representative of a peak amplitude of said voltage appearing across said first capacitor; and using said held voltage to adjust said first current thereby adjusting the peak amplitude of said voltage ramp signal appearing across said first capacitor.

7. A circuit for providing a voltage ramp signal having minimum amplitude variation over a frequency range, comprising:

first means responsive to a pulse signal for discharging and charging a first capacitor, said first means having an input and an output, said input of said first means coupled to receive Said pulse signal, said output of said first means coupled for providing the voltage ramp signal;

a second capacitor having first and second terminals, said second terminal of said second capacitor coupled to a first supply voltage terminal;

second means responsive to said pulse signal for discharging said second capacitor when a voltage appearing across said first capacitor is less than a reference voltage and for charging said second capacitor when a voltage appearing across said first capacitor is greater than said reference voltage, said second means having an input and an output, said input of said second means coupled to said output of said first means, said output of said second means coupled to said first terminal of said second capacitor;

third means responsive to said pulse signal for holding a voltage appearing across said second capacitor, said third means having an input and an output, said input of said third means coupled to said first terminal of said second capacitor; and fourth means responsive to a voltage appearing at said output of said third means for adusting a current for charging said first capacitor, said fourth means having an input and an output, said input of said fourth means coupled to said output of said third means, said output of said fourth means coupled to said output of said first means.

8. The circuit according to claim 7 wherein said second means includes:

a comparator having first and second inputs and first and second outputs and an enable input, said enable input of said comparator coupled to receive said pulse signal, said first input of said comparator coupled to said output of said first means, said second input of said capacitor coupled to receive said first reference voltage;

a first switchable current source having first and second terminals and a control terminal, said first terminal of said first switchable current source coupled to said output of said second means, said second terminal of said first switchable current source coupled to said first supply voltage terminal, said control terminal of said first switchable current source coupled to said second output of said comparator; and a second switchable current source having first and second terminals and a control terminal, said first terminal of said second switchable current source coupled to a second supply voltage terminal, said second terminal of said second switchable current source coupled to said output of said second means, said control terminal of said second switchable current source coupled to said first output of said comparator.

\* \* \* \* \*